United States Patent
Suzuki

(10) Patent No.: US 8,934,858 B2
(45) Date of Patent: Jan. 13, 2015

(54) DIGITAL DEMODULATION CIRCUIT USING AUTOMATIC GAIN CONTROL CIRCUIT HAVING TEMPERATURE COMPENSATION FUNCTION

(75) Inventor: Yuuzou Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 6 days.

(21) Appl. No.: 13/979,109

(22) PCT Filed: Jan. 17, 2012

(86) PCT No.: PCT/JP2012/050801
§ 371 (c)(1),
(2), (4) Date: Jul. 10, 2013

(87) PCT Pub. No.: WO2012/099098
PCT Pub. Date: Jul. 26, 2012

(65) Prior Publication Data
US 2013/0288630 A1    Oct. 31, 2013

(30) Foreign Application Priority Data

Jan. 17, 2011 (JP) ................................. 2011 006608

(51) Int. Cl.
*H04B 1/06* (2006.01)
*H04B 7/00* (2006.01)
*H03D 9/00* (2006.01)
(Continued)

(52) U.S. Cl.
CPC ............... *H03D 9/00* (2013.01); *H03G 3/3052* (2013.01); *H04L 25/4902* (2013.01); *H04L 27/2332* (2013.01); *H04L 27/3809* (2013.01)
USPC ...................... 455/232.1; 455/234.1; 375/345; 330/253; 330/278

(58) Field of Classification Search
CPC .......... H03F 2200/78; H03F 2200/294; H03F 2200/372; H03F 2200/435; H03G 3/3068; H04W 52/52

USPC ..................... 455/232.1, 234.1, 234.2, 235.1; 375/345; 330/253, 278
See application file for complete search history.

(56) References Cited

U.S. PATENT DOCUMENTS 5,408,698 A * 4/1995 Serizawa et al. ........... 455/245.1
5,832,373 A   11/1998 Nakanishi et al.
(Continued)

FOREIGN PATENT DOCUMENTS

JP    08-274559 A    10/1996
JP    11-355376 A    12/1999
(Continued)

OTHER PUBLICATIONS

International Search Report for PCT/JP2012/050801, dated Apr. 10, 2012.

*Primary Examiner* — Quochien B Vuong
(74) *Attorney, Agent, or Firm* — Sughrue Mion, PLLC

(57) ABSTRACT

A digital demodulation circuit amplifies a received signal of an intermediate frequency with a variable gain control amplifier so as to convert it into a baseband signal, which is separated into a common-mode component and an orthogonal component. A first gain control voltage is generated based on the common-mode component and the orthogonal component. Additionally, a temperature correction value is generated by smoothing a pulse-width modulation signal, having a pulse width corresponding to ambient temperature, and by adding a predetermined gain and an offset thereto. A second gain control voltage is generated by adding the temperature correction value to the first gain control voltage. The variable gain control amplifier amplifies a received signal with the second gain control voltage. Thus, it is possible to achieve a temperature compensation function and an automatic gain control function in the digital demodulation circuit with a simple circuit configuration.

7 Claims, 13 Drawing Sheets

(51) Int. Cl.
*H03G 3/30* (2006.01)
*H04L 25/49* (2006.01)
*H04L 27/233* (2006.01)
*H04L 27/38* (2006.01)

(56) References Cited

U.S. PATENT DOCUMENTS 6,229,397 B1 * 5/2001 Miura .................... 330/289
6,844,782 B2 * 1/2005 Otaka .................... 330/254
6,940,339 B2 * 9/2005 Otaka .................... 455/343.1
7,430,406 B2 * 9/2008 Filipovic ................ 455/240.1

FOREIGN PATENT DOCUMENTS

| | | |
|---|---|---|
| JP | 2004-336359 A | 11/2004 |
| JP | 2006-186696 A | 7/2006 |
| JP | 2010-199490 A | 9/2010 |

* cited by examiner

FIG. 4

| AMBIENT TEMPERATURE (°C) | OUTPUT OF TEMPERATURE SENSOR 30 (8 BIT) | PWM WAVEFORM (ONE CYCLE) | PWM WAVEFORM (DUTY RATIO) |
|---|---|---|---|
| 0 | 00000000 | ⌐_____ | ABOUT 0.4% |
| 0.25 | 00000001 | ⌐_____ | ABOUT 0.8% |
| ⋮ | | | |
| 20 | 01010000 | ⌐‾⌐_____ | ABOUT 32% |
| ⋮ | | | |
| 63.5 | 11111110 | ‾‾‾‾‾‾‾‾⌐ | ABOUT 99.6% |
| 63.75 | 11111111 | ‾‾‾‾‾‾‾‾‾ | 100% |

DIGITAL DEMODULATION CIRCUIT USING AUTOMATIC GAIN CONTROL CIRCUIT HAVING TEMPERATURE COMPENSATION FUNCTION

TECHNICAL FIELD

The present invention relates to a digital demodulation circuit using an automatic gain control circuit having a temperature compensation function.

This application is a National Stage of International Application No. PCT/JP2012/050801 filed Jan. 17, 2012, claiming priority based on Japanese Patent Application No. 2011-006608 filed Jan. 17, 2011, the contents of all of which are incorporated herein by reference in their entirety.

BACKGROUND ART

Generally, variable gain amplifiers (VGA: Variable Gain Amplifier) have been widely used in digital demodulation circuits. Digital demodulation circuits demodulate digital signals from modulated waves which are produced by modulating carrier waves with digital signals.

Patent Literatures 1, 2 disclose technologies compensating for temperature variations in digital demodulation circuits. Patent Literature 1 discloses a temperature compensation method for an automatic gain control circuit (AGC: Automatic Gain Control), which corrects temperature detected by a temperature sensor so as to apply it to a baseband process in a communication device. Patent Literature 2 discloses a temperature compensation method adapted to a digital wireless terminal, which achieves temperature compensation for amplifier-gain parameters in an analog processing part by use of a parameter memory device of a digital processing part.

In the technologies of Patent Literatures 1, 2, temperature correction data, corresponding to temperature information, have been stored in a memory device in advance, and therefore CPU processing is performed to read temperature correction data from the memory device, thus achieving temperature compensation for control values applied to a variable gain amplifier.

CITATION LIST

Patent Literature

Patent Literature 1: Japanese Patent Application Publication No. 2004-336359
Patent Literature 2: Japanese Patent Application Publication No. 2006-186696

SUMMARY OF INVENTION

Technical Problem

The digital demodulation circuits disclosed in Patent Literatures 1, 2 need to store temperature correction data, corresponding to temperature information, in a plurality of memory devices. Additionally, they need a configuration for reading temperature correction data from memory devices in response to temperature information during operations of digital demodulation circuits. This may give rise to a problem of an expanding circuit scale of a digital demodulation circuit.

The present invention is made in consideration of the aforementioned circumstances, and therefore it aims to provide a digital demodulation circuit achieving a temperature compensation function for an automatic control circuit with a simple configuration.

Solution to Problem

The present invention is directed to a digital demodulation circuit including a variable gain control amplifier which amplifies a received signal of an intermediate frequency; an orthogonal demodulator which converts a received signal, amplified by the variable gain control amplifier, into a baseband signal so as to separate it into a common-mode component and an orthogonal component; an A/D converter which converts a common-monde component and an orthogonal component, included in a baseband signal, into digital signals; a gain control circuit which generates a first gain control voltage based on digital signals; a temperature compensation circuit which generates and smoothes a pulse-width modulation signal having a pulse width, corresponding to ambient temperature, and which generates a temperature correction value adding an offset and a predetermined gain, compensating for variations in ambient temperature, thereto; and an adder which adds the temperature correction value to the first gain control voltage so as to generate a second gain control voltage. The variable gain control amplifier amplifies a received signal with a gain corresponding to the second gain control voltage.

The present invention is directed to a receiver device which receives a radio frequency signal so as to convert it into a received signal of an intermediate frequency, thus implementing digital demodulation with a temperature compensation function and an automatic gain control function by way of the digital demodulation circuit.

Advantageous Effects of Invention

According to the present invention, the temperature compensation circuit adds an offset and a predetermined gain, compensating for temperature variations in the variable gain control amplifier, to temperature data representing ambient temperature, thus generating an analog temperature correction value. Additionally, a low-pass filter is used to smooth a pulse-width signal having a pulse width, corresponding to ambient temperature; hence, it is possible to generate an analog temperature correction value with a relatively simple circuit configuration. Thus, the present invention is able to achieve temperature compensation for analog circuit elements, inside a digital demodulation circuit, with a relatively simple circuit configuration.

BRIEF DESCRIPTION OF DRAWINGS

FIG. 4 An illustration of the relationship between ambient temperatures and PWM modulation waveforms.

DESCRIPTION OF EMBODIMENT

The embodiment of the present invention will be described in detail with reference to the drawings. To clarify the feature of the present invention, the configuration and the operation of a digital demodulation circuit using an automatic gain control circuit, not implementing a temperature compensation function, will be described with reference to FIGS. 10 to 18. Thereafter, the configuration and the operation of a digital demodulation circuit using an automatic gain control circuit implementing a temperature compensation function corresponding to the feature of the present invention will be described in detail with reference to FIGS. 1 to 9.

Figure 10:
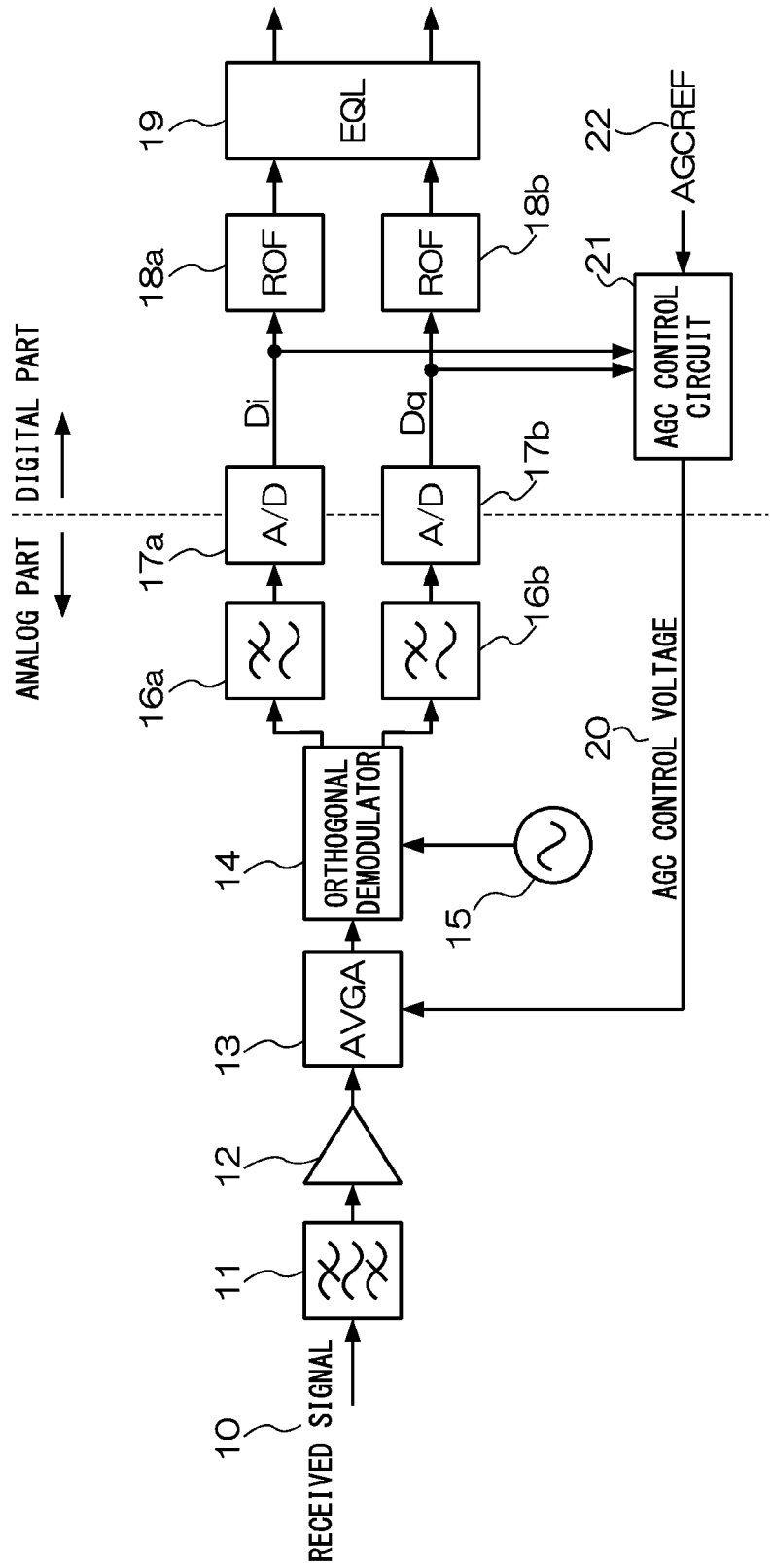
FIG. 10 A block diagram of a digital demodulation circuit using an automatic gain control circuit not implementing a temperature compensation function.

FIG. 10 is a block diagram showing the configuration of a digital demodulation circuit using an automatic gain control circuit, not implementing a temperature compensation function. The digital demodulation circuit receives a received signal 10 having an intermediate frequency (IF: Intermediate Frequency) converted from a radio frequency (RF: Radio Frequency). The received signal 10 is input to a BPF (Band Pass Filter) 11 to remove unnecessary frequency components therefrom. The received signal 10, passing through the BPF 11, is amplified by an intermediate frequency power amplifier (an IF amplifier) 12 and then forwarded to an AVGA (Analog Voltage Variable Gain Control Amplifier: i.e. an analog voltage control VGA) 13. The AVGA 13 changes the gain of an internal amplifier in response to an AGC control voltage 20, supplied from an AGC control circuit 21 (AGC: Analog Voltage Gain Control; Automatic Gain Control), thus achieving a function for maintaining a constant output level irrespective of input-level variations. An orthogonal demodulator 14 converts an IF signal, supplied from the AVGA 13, into a baseband signal (BB) by use of an oscillation signal supplied from a local oscillator (LO) 15, thus separating it into a common-mode component (Pch) and an orthogonal component (Qch). The orthogonal demodulator 14 supplies the common-mode component of a baseband signal to an A/D (Analog/Digital) converter 17a via an LPF (Low Pass Filter) 16a while supplying the orthogonal component to an A/D converter 17b via an LPF 16b. The A/D converter 17a converts the common-mode component of a baseband signal into a digital signal Di, which is supplied to an EQL (Equalizer) 19 via a digital filter ROF (Root Cosine Roll Off Filter) 18a. Additionally, the A/D converter 17b converts the orthogonal component of a baseband signal into a digital signal Dq, which is supplied to the EQL 19 via an ROF 18b. The EQL 19 is a linear equalizer for removing intersymbol interference components from digital signals Di, Dq. As other functions, the digital demodulation circuit includes a carrier synchronization function for synchronizing the frequency of an oscillation signal of the LO 15 with the frequency of the received signal 10, and a clock synchronization function for synchronizing sampling clock phases, used for the A/D conversion in the A/D converters 17a, 17b, with the optimum phase. These functions are not directly related to the embodiment of the present invention; hence, detailed descriptions thereof will be omitted here.

Next, an AGC control circuit 21, which is a main constituent element of the present invention, will be described here. The AGC control circuit 21 receives digital signals Di, Dq from the A/D converters 17a, 17b so as to calculate the sum of square thereof, thus producing instantaneous power $P(=Di^2+Dq^2)$. The instantaneous power P is compared to a predetermined threshold ACGREF 22. The AGC control circuit 21 smoothes the comparison result to generate an AGC control voltage 20, which is forwarded to the AVGA 13. The AVGA 13 changes the gain of an internal amplifier in accordance with the AGC control voltage 20, and therefore it is possible to normally maintain the constant output level even irrespective of a variation in the level of the power amplifier 12 due to a variation in the level of the received signal 10.

Figure 11:
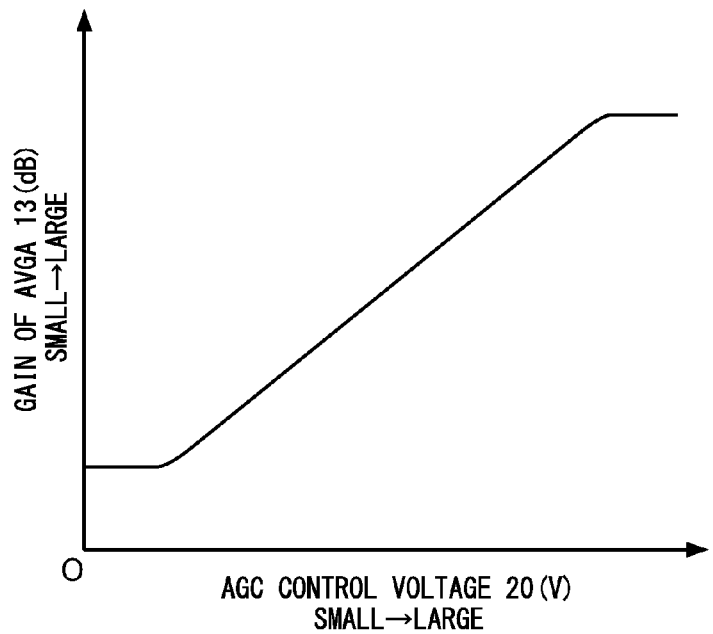
FIG. 11 A graph of characteristics with respect to an AVGA gain and an AGC voltage.
Figure 12:
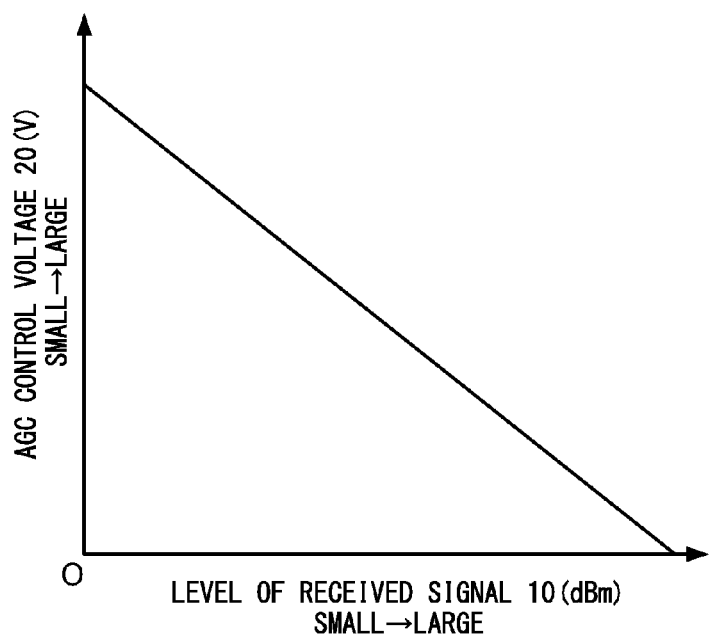
FIG. 12 A graph of characteristics with respect to an AGC control voltage and a received signal level.

FIG. 11 shows characteristics with respect to the gain of the AGVA 13 and the AGC voltage 20, and FIG. 12 shows characteristics with respect to the AGC control voltage 20 and the level of the received signal 10. For the sake of convenience, the following description is based on the assumption that the gain of the AVGA 13 may increase linearly with an increase of the AGC control voltage 20. The operation of the AGC control circuit 21 will be described with reference to FIGS. 11 and 12. When the received signal 10 decreases in level, for example, the input level to the A/D converters 17a, 17b correspondingly decreases, and therefore the instantaneous power P, which is calculated based on digital signals Di, Dq after the A/D conversion, may become lower than the threshold AGCREF 22. At this time, the AGC control circuit 21 increases the AGC control voltage 20 so as to increase the gain of an internal amplifier in the AVGA 13, thus inhibiting a reduction of the output level of the AVGA 13 and a reduction of the input level of the A/D converters 17a, 17b. On the other hand, when the received signal 10 increases in level so as to increase the input level of the A/D converters 17a, 17b, the instantaneous power P becomes higher than the threshold AVGREF 22 while the AGC control circuit 21 decreases the AGC control voltage 20 so as to decrease the gain of an internal amplifier in the AVGA 13, thus inhibiting an increase of the output levels of the AVGA 13 and an increase of the input levels of the A/D converters 17a, 17b. That is, the digital demodulation circuit shown in FIG. 10 produces the AGC control voltage 20 based on the comparison result between the instantaneous power $P(=Di^2+Dq^2)$, which is calculated based on the digital signals Di, Dq fo the A/D converters 17a, 17b, and the threshold AGCREF 22, thus controlling the gain of an internal amplifier in the AVGA 13 and maintaining the constant input level of the A/D converters 17a, 17b. I is therefore possible to maintain the input level of the A/D converters 17a, 17b at substantially the threshold AGCREF 22 under the foregoing condition varying the of the received signal 10.

Figure 13:
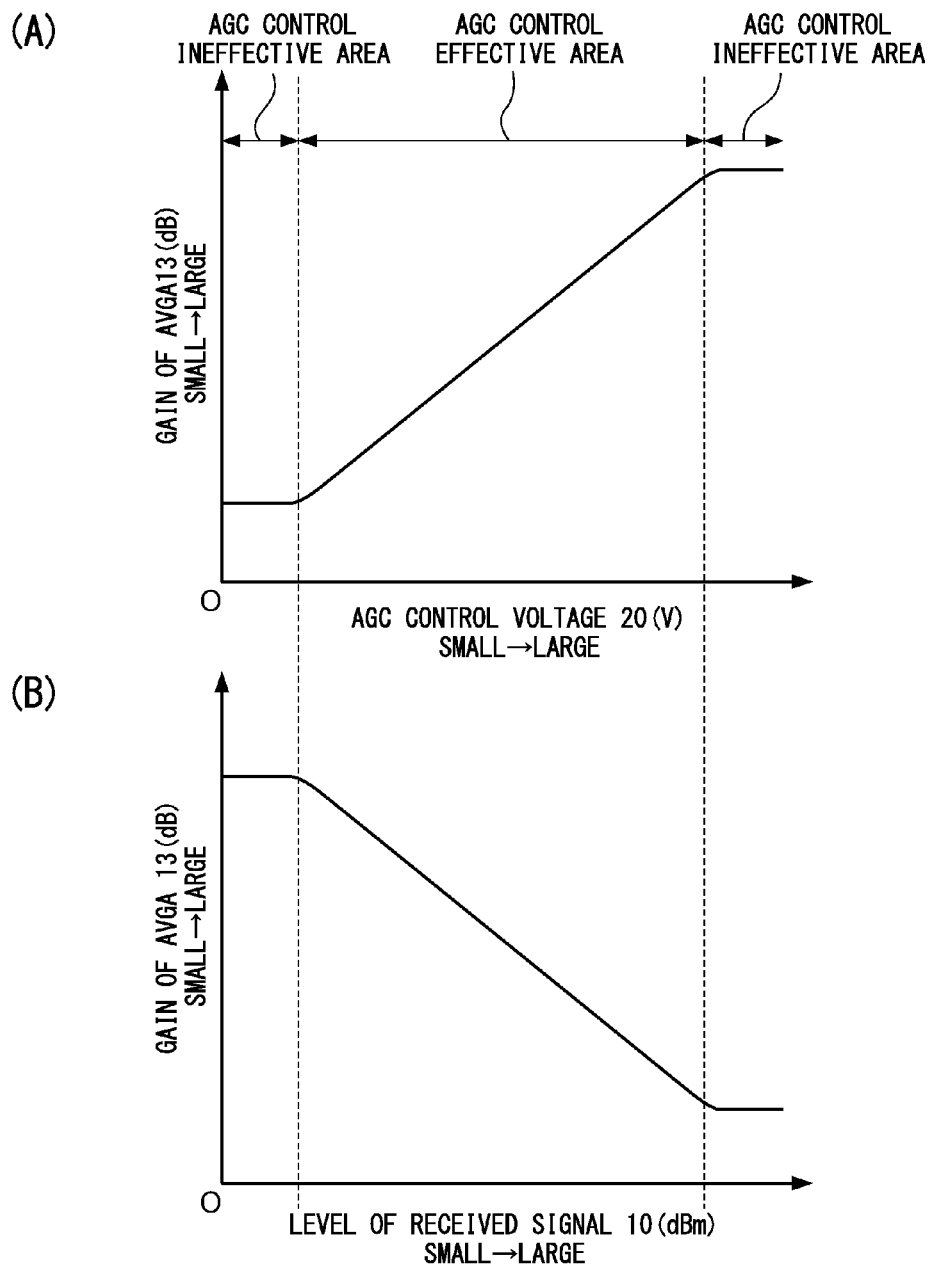
FIG. 13 (A) A graph of characteristics with respect to an AVGA gain and an AGC control voltage; (B) A graph of characteristics with respect to an AVGA gain and a received signal level.
Figure 14:
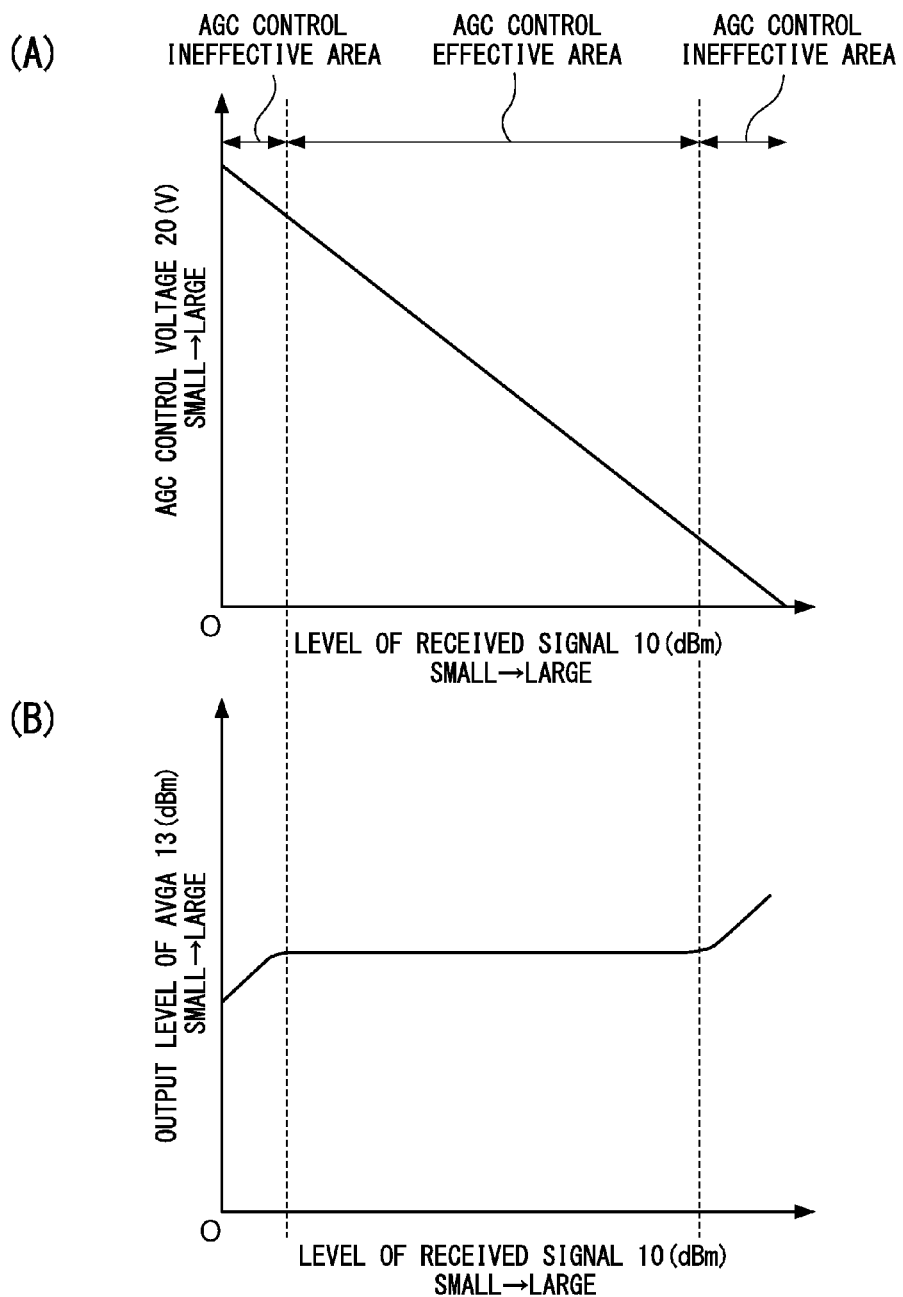
FIG. 14 (A) A graph of characteristics with respect to an AGC control voltage and a received signal level; (B) A graph of characteristics with respect to an AVGA output level and a received signal level.

However, it is inevitable to limit the range of AGC-controllable input levels due to device limitation on a gain characteristic of an internal amplifier in the AVGA 13. In addition to the characteristics shown in FIGS. 11 and 12, FIGS. 13 and 14 shows characteristics with respect to the gain of the AVGA 13 and the received signal 10, and characteristics with respect to the output level of the AVGA 13 and the received signal 10. Herein, the received signal 10 represents an IF input signal (i.e. an input signal of the BPF 11) in the digital demodulation circuit. As shown in FIGS. 13 and 14, AGC control effective areas are areas in which the gain of the AVGA 13 are linearly varied in response to variations of the AGC control voltage 20. As long as a level-varying range of the received signal 10 falls within the AGC control effective area, it is possible to vary and control the gain of an internal amplifier in the AVGA 13, thus maintaining the constant output level of the AVGA 13. The gain of the AVGA 13 remains constant in an AGC control ineffective area irrespective of variations of the AGC control voltage 20. For this reason, it is impossible to control the gain of an internal amplifier in the AVGA 13 and maintain the constant output level of the AVGA 13 as long as the level-varying range of the received signal 10 falls within the AGC control ineffective area. Therefore, a reduction in the level of the received signal 10, causing a reduction of the output level of the AVGA 13, may degrade an S/N ratio (i.e. a ratio of signal power to noise power) in the digital demodulation circuit. On the other hand, an increase of the level of the received signal 10, causing an increase of the output level of the AVGA 13, may degrade transmission characteristics due to waveform distortion in the digital demodulation circuit. This may degrade radio transmission characteristics unless the level-varying range of the received signal 10 falls within the AGC control effective area.

Figure 15:
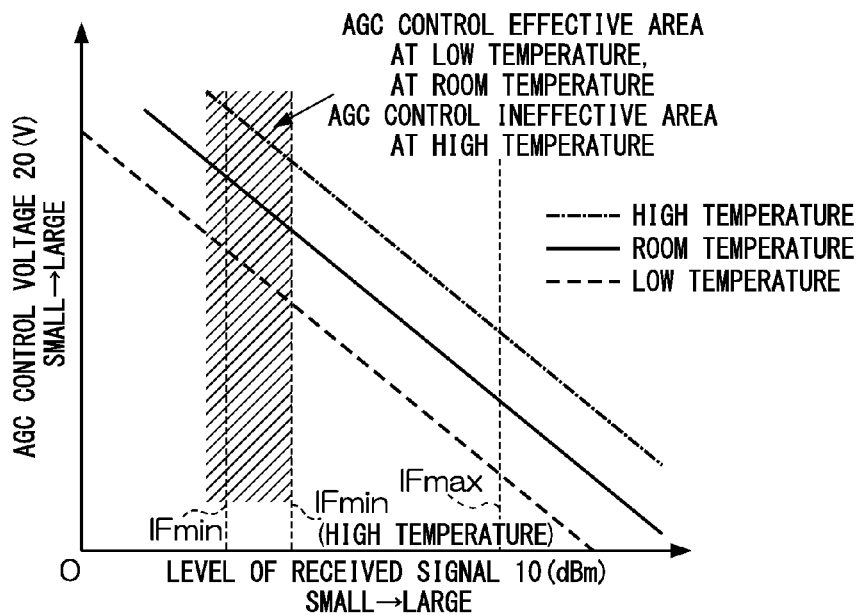
FIG. 15 A graph of characteristics with respect to an AGC control voltage and a received signal level due to variations in ambient temperature.
Figure 16:
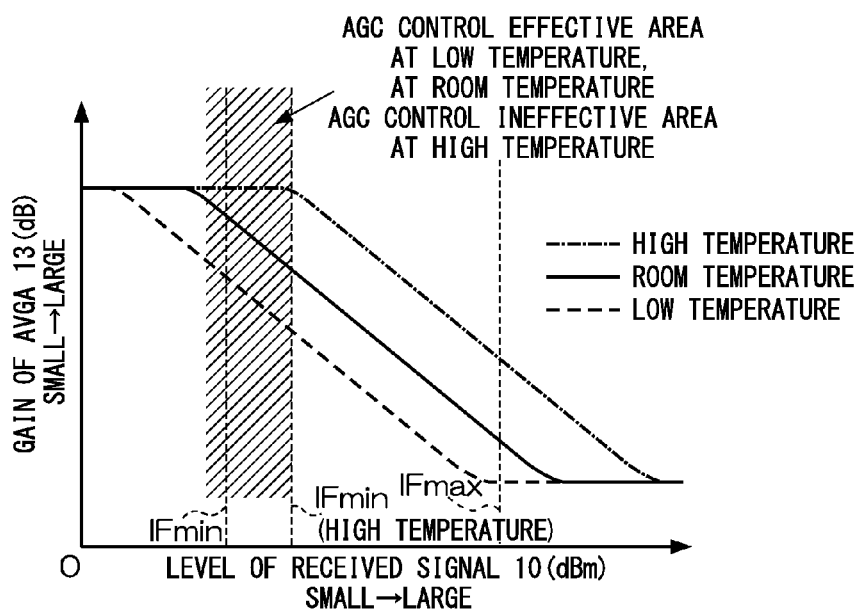
FIG. 16 A graph of characteristics with respect to an AVGA gain and a received signal level due to variations in ambient temperature.
Figure 17:
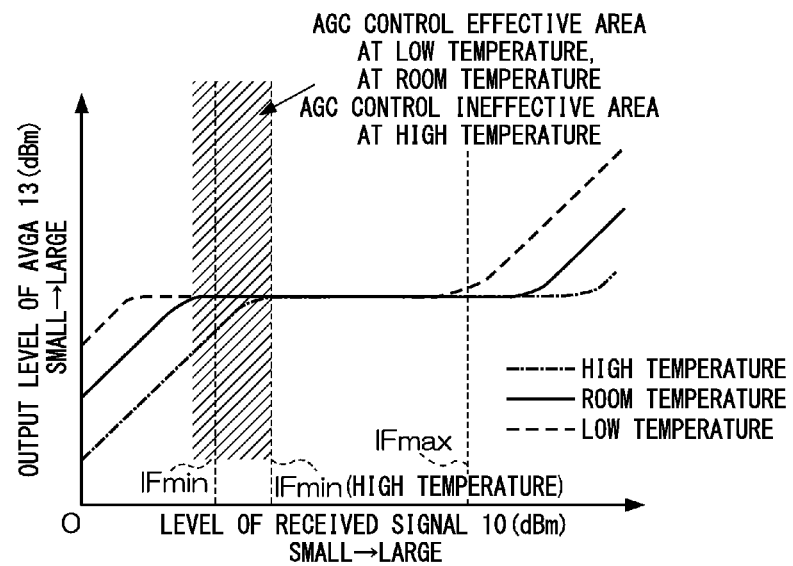
FIG. 17 A graph of characteristics with respect to an AVGA output level and a received signal level due to variations in ambient temperature.

The AGC control effective area varies depending on ambient temperature. In the digital demodulation circuit, active devices such as the power amplifier 12, the AVGA 13, and the orthogonal demodulator 14, generally possess properties in that gains may decrease with increases in temperature increase or gains may increase with a reduction in temperature. FIGS. 15 to 17 show the characteristics with respect to the AGC control voltage 20, the gain of AVGA 13, and the output level of the AVGA 13 relative to the level of the received signal 10 due to variations in ambient temperature. In FIGS. 15 to 17, solid lines indicate characteristics at room temperature (e.g. 27° C.); dotted lines indicate characteristics at low temperature (i.e. the lower-limit temperature in an operation range); and dashed lines indicate characteristics at high temperature (i.e. the upper-limit temperature in an operation range). According to the characteristics shown in FIGS. 15 to 17, the digital demodulation circuit decreases the AGC control voltage 20 so as to increase the gain of an internal amplifier in the AVGA 13 due to an increase of temperature while increasing the AGC control voltage 20 so as to decrease the gain of an internal amplifier in the AVGA 13 due to a reduction of temperature, thus absorbing variations of gains of active devices due to temperature variations. This shows that the AGC control effective area (i.e. the area in which the gain of the AVGA 13 is linearly varied in response to variations in the level of the received signal 10) is shifted in response to temperature variations in the digital demodulation circuit. According to the characteristics shown in FIGS. 15 to 17, the AGC-controllable range should be shifted at high temperature even when the level-varying range (IFmin to IFmax) of the received signal 10 is set to the AGC control effective area at room temperature; this may incapacitate AGC control when the level of the received signal 10 falls within the range of IFmin to IFmax (high temperature). In this case, a level reduction of the received signal 10 may cause a reduction in the output level of the AVGA 13, and therefore radio transmission characteristics may be degraded under the influence of a degraded S/N ratio due to a reduction in the signal level. With variations in ambient temperature, the digital demodulation circuit, using the conventional automatic gain control circuit shown in FIG. 10, may be unable to keep the level-varying range of the received signal 10 within the AGC control effective area, thus degrading radio transmission characteristics.

Figure 18:
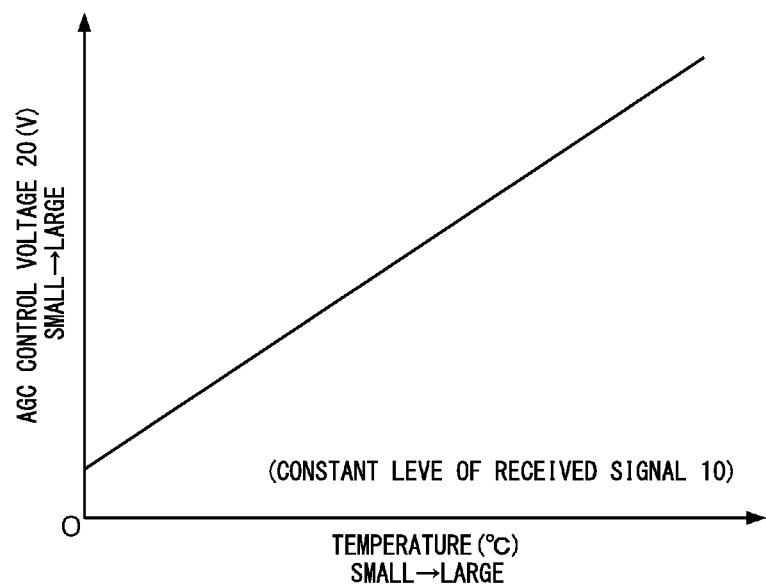
FIG. 18 A graph of characteristics with respect to an AGC control voltage and temperature.

FIG. 18 shows the characteristics with respect to the AGC control voltage 20 (before temperature compensation) and ambient temperature. Herein, the received signal 10 remains at the constant level. As shown in FIG. 18, in order to absorb a reduction of gains of active devices, configuring the digital demodulation circuit, due to an increase of temperature, the AGC control circuit 21 smoothes the comparison result between the instantaneous power $P(=Di^2+Dq^2)$, based on the sum of square of digital signals Di, Dq of the A/D converters 17a, 17b, and the threshold AGCREF 22, thus generating the AGC control voltage 20.

The digital demodulation circuit according to the embodiment of the present invention is characterized in that the automatic gain control circuit generates a control value, which is smoothly and continuously varied in response to variations in ambient temperature based on temperature information detected by a temperature sensor, so as to adjust a temperature-dependent variation rate of the control value, thus generating a temperature correction value canceling out the influence of temperature for the AGC control voltage 20. Thus, it is possible to maintain the AGC control voltage and the constant gain of the AVGA 13 irrespective of variations in ambient temperature; hence, it is possible to prevent the radio transmission characteristic from being degraded due to temperature variations in the AGC-controllable range beforehand.

Figure 1:
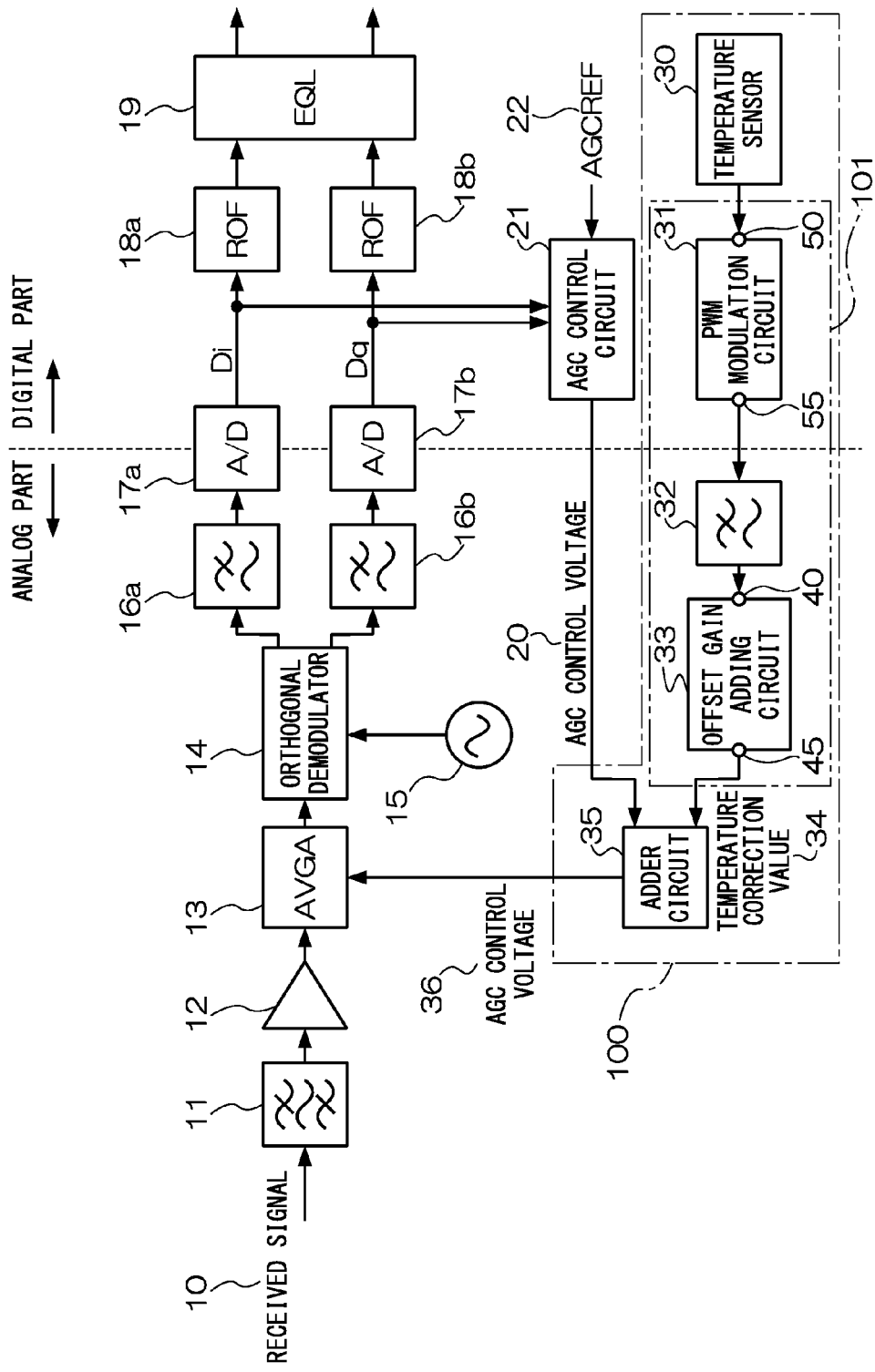
FIG. 1 A block diagram of a digital demodulation circuit using an automatic gain control circuit, achieving a temperature compensation function, according to one embodiment of the present invention.

FIG. 1 is a block diagram showing a digital demodulation circuit according to one embodiment of the present invention. In FIG. 1, constituent elements identical to those of FIG. 10 are specified using the same reference signs. The digital demodulation circuit of FIG. 1 employs an automatic gain control compensation method, which newly introduces a block 100, encompassed by a dashed line, in addition to the constituent elements included in the digital demodulation circuit of FIG. 10 not implementing a temperature compensation function. The block 100 includes a temperature sensor 30, a PWM (Pulse Width Modulation) modulation circuit 31, an LPF (Low Pass Filter) 32, an offset gain adding circuit 33, and an adder circuit 35. For example, the temperature sensor 30 detects ambient temperature around the power amplifier 12, the AVGA 13, and the orthogonal demodulator 14, thus outputting a digital value indicating ambient temperature (i.e. temperature information). The PWM modulation circuit 31 outputs a PWM modulated waveform with a duty ratio of pulse waves varied based on the temperature information of the temperature sensor 30. The LPF 32 smoothes the PWM modulated waveform to extract a dc component therefrom. The offset gain adding circuit 33 multiplies a dc component, supplied from the LPF 32, by an appropriate gain (or a predetermined multiplier) while adding an appropriate offset (or a predetermined constant) to it, thus outputting a temperature correction value 34. The adder circuit 35 adds the temperature correction value 34 to the AGC control voltage 20 of the AGC control circuit 21 so as to produce an AGC control voltage 36, which is forwarded to the AVGA 13. Additionally, a block 101 indicates a temperature correction value generating circuit.

In FIG. 1, an analog part is configured of the BPF 11, the power amplifier 12, the AVGA 13, the orthogonal demodulator 14, the LO 15, the LPF 16a, the LPF 16b, the input side of the A/D converter 17a, the input side of the A/D converter 17b, the LPF 32, the offset gain adding circuit 33, and the adder circuit 35. Additionally, a digital part is configured of the output side of the A/D converter 17a, the output side of the A/D converter 17b, the ROF 18a, the ROF 18b, the EQL 19, the AGC control circuit 21, the output side of the temperature sensor 30, and the PWM modulation circuit 31.

Figure 2:
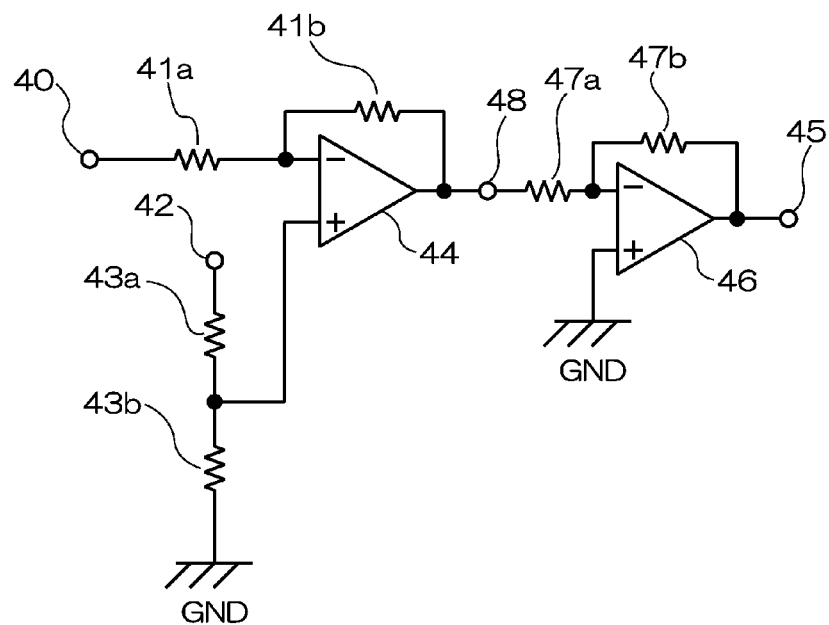
FIG. 2 A circuit diagram of an offset gain adding circuit shown in FIG. 1.

FIG. 2 is a circuit diagram of the offset gain adding circuit 33. The offset gain adding circuit 33 is configured of an inverting amplifier circuit using an operational amplifier 44. The dc component smoothed by the LPF 32 is supplied to an input terminal 40. Resistors 41a, 41b serve as gain-adding resistors. Resistors 43a, 43b serve as offset adding resistors, which divides a supply voltage (or a constant voltage), applied to a terminal 42, to generate an offset value. The method for setting the resistors 41a, 41b, 43a, and 43b will be described in the following operation explanation. The dc component, to which the offset gain adding circuit 33 adds a desired gain and an offset, is output as a temperature correction value 34 from an output terminal 45.

Figure 3:
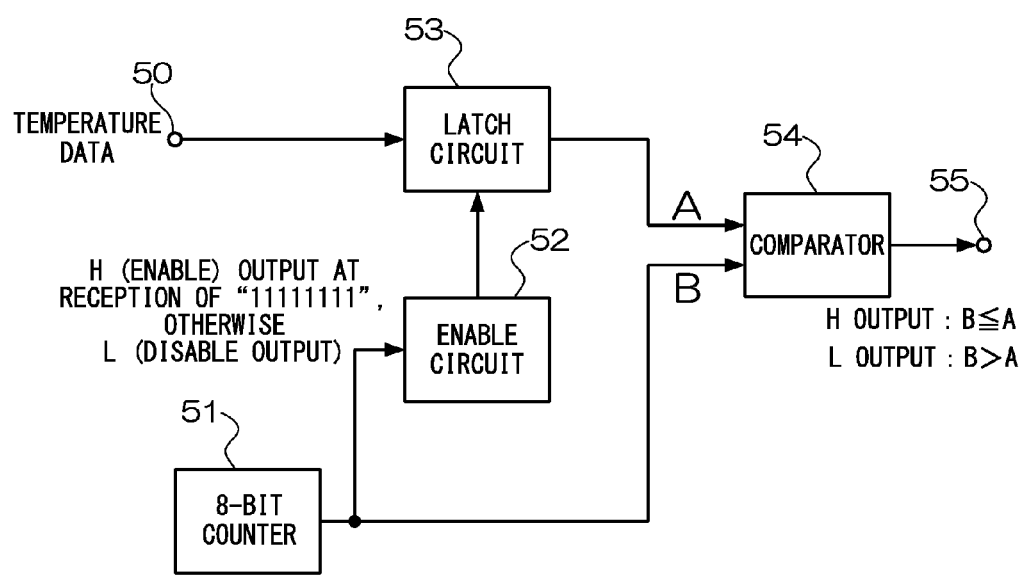
FIG. 3 A block diagram of a PWM modulation circuit shown in FIG. 1.

FIG. 3 is a block diagram of the PWM modulation circuit 31 including functional blocks all of which operate with the same clock. In FIG. 3, the temperature information (i.e. temperature data) detected by the temperature sensor 30 is input to an input terminal 50. For example, the temperature data indicates an 8-bit digital value. A latch circuit 53 reads temperature data only when a control signal (i.e. a pulse signal) of an Enable circuit 52 indicates a high level "H (Enable)". It latches temperature data, which was read in response to the control signal of "H(Enable)", when the control signal of the Enable circuit 52 indicates a low level "L". The Enable circuit 52 generates a control signal applied to the latch circuit 53 based on a count value of an 8-bit counter 51. A comparator 54 compares temperature data A of the latch circuit 53 with a count value B of the 8-bit counter 51 so as to generate a PWM waveform, which is output to an output terminal 55.

Next, the operation of the digital demodulation circuit of FIG. 1 will be described. For the sake of convenience, the AGC control range at room temperature (27° C.) has been adjusted to achieve optimum wireless transmission characteristics in the level-varying range of the received signal 10 (IFmin to IFmax).

As shown in FIG. 18, the AGC control circuit 12 increases the AGC control voltage 20, before temperature compensation, in order to absorb a reduction of gains of active devices configuring the digital demodulation circuit due to an increase of temperature. An increase of the AGC control voltage 20 may cause an increase of the gain of the AVGA 13. In order to achieve optimum temperature compensation, it is necessary to carry out adequate temperature compensation on the AGC control voltage 20 so as to suppress the AGC control voltage 20 and a temperature-dependent variation in the gain of the AVGA 13, thus normally maintaining the AGC control range relative to the level of the received signal 10 (IFmin to IFmax) in the optimum range (i.e. the AGC control range at room temperature (27° C.)). Considering the above, the temperature compensation of the AGC control circuit 21 will be described.

Figure 5:
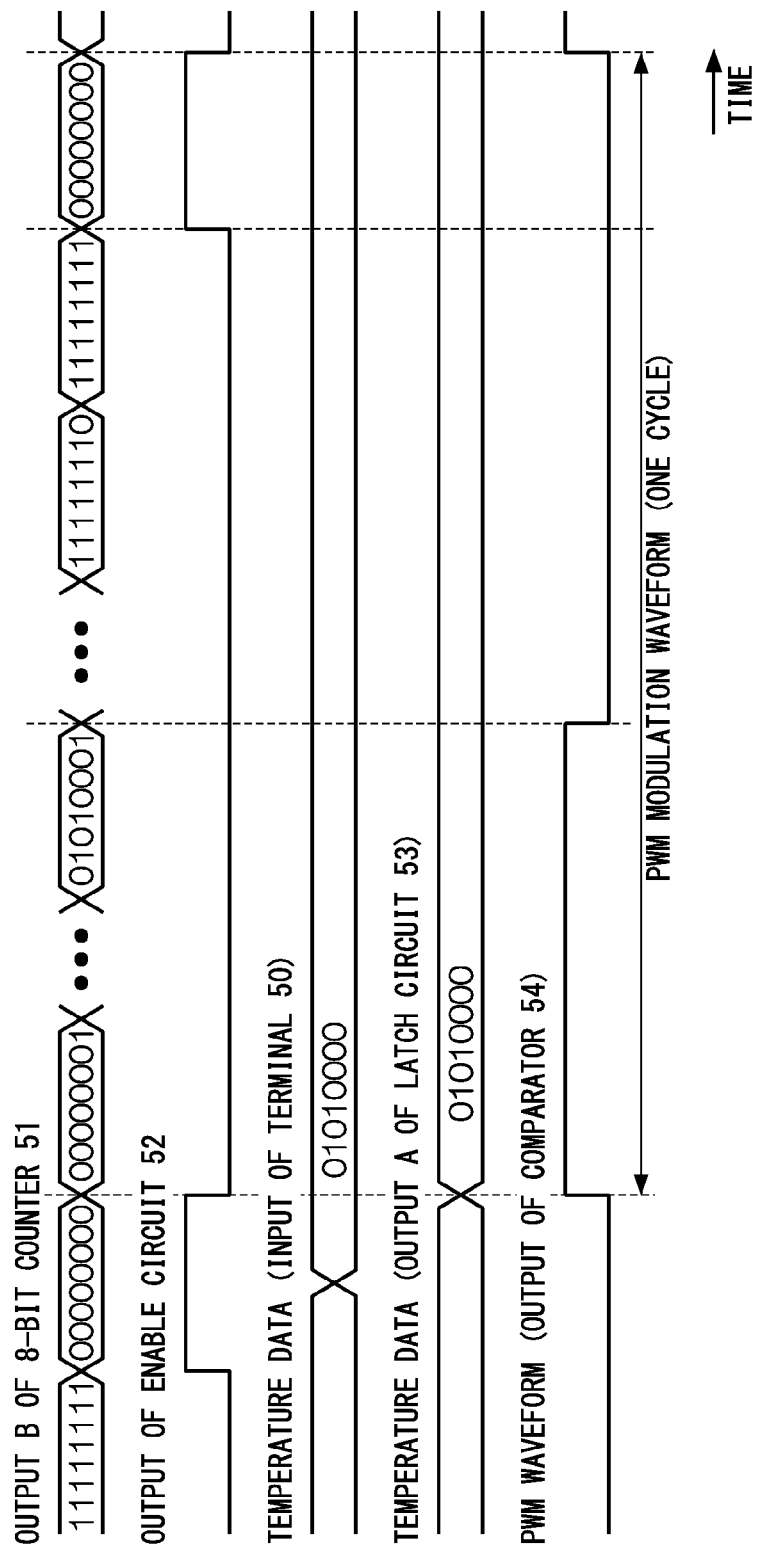
FIG. 5 A time chart showing time variability of operating waveforms at various points in the PWM modulation circuit.

In FIG. 1, the temperature sensor 30 detects ambient temperature so as to send temperature data, representing 8-bit digital value, to the PWM modulation circuit 31. The PWM modulation circuit 31 carries out PWM modulation on temperature data so as to generate a modulation signal (or a PWM modulation waveform). FIG. 4 shows the relationship between the PWM modulation waveform and ambient temperature, and FIG. 5 shows operating waveforms at various points in the PWM modulation circuit 31. As shown in FIG. 5, the 8-bit counter 51 repeatedly counts an 8-bit binary number ranging from "00000000 (i.e. "0" in decimal notation)" to "11111111 (i.e. "255" in decimal notation). The Enable circuit 52 sends a high-level control signal "H (Enable)" to the latch circuit 53 only when the 8-bit counter 51 produces the count value of "11111111". The latch circuit 53 reads temperature data only when the control signal indicates "H (Enable)". The latch circuit 53 latches temperature data, which was read in response to the control signal of "H (Enable)", when the control signal of the Enable circuit 52 indicates "L". The comparator 54 outputs a high level "H" when the count value B of the 8-bit counter 51 is equal to or less than temperature data A of the latch circuit 53 (B≤A), while it outputs a low level "L" when the count value B is higher than temperature data A (B>A). Thus, the comparator 54 outputs a PWM waveform. The period of the PWM waveform is 256 times higher than the clock-pulse period of the 8-bit counter 51, wherein the duty ratio thereof may increase in proportion to an increase of ambient temperature.

FIG. 4 shows examples regarding the output value (temperature data) of the temperature sensor 30, the output value (the PWM waveform) of the latch circuit 53, and the duty ratio (i.e. a ratio of a high-level "H" period to one cycle). Herein, a minimum operating temperature is set to "0° C.". FIG. 5 is a time chart showing time variations regarding the output value (the count value B) of the 8-bit counter 51, the output (i.e. the control signal) of the Enable circuit 52, temperature data (i.e. the input of the terminal 50), temperature data (i.e. the output A of the latch circuit 53), and the PWM waveform (i.e. the output of the comparator 54).

Figure 6:
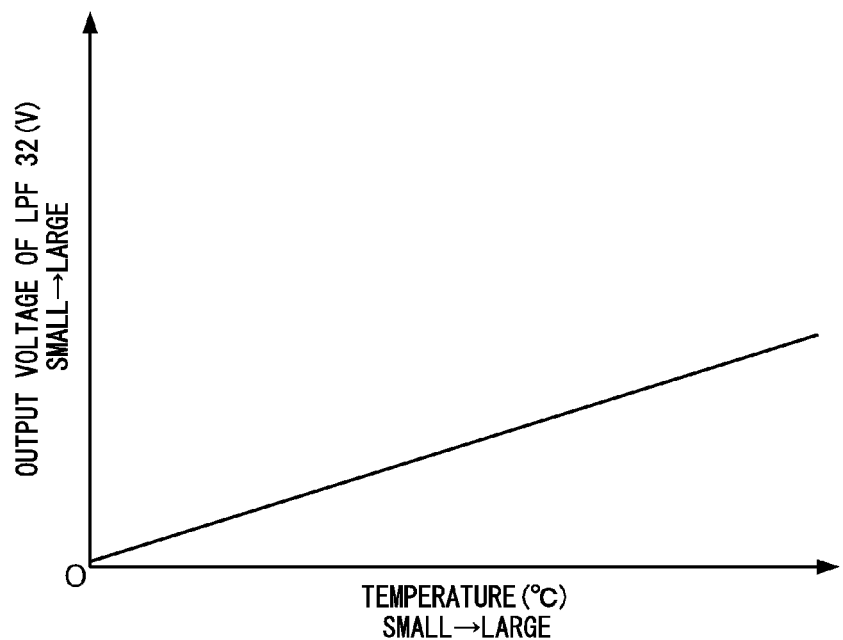
FIG. 6 A graph of the relationship between an LPF output voltage and variations in ambient temperature.

In FIG. 1, the LPF 32 smoothes the PWM modulation waveform of the PWM modulation circuit 31 to extract a dc component therefrom. FIG. 6 shows the relationship between variations in ambient temperature and the output signal of the LPF 32. The dc component smoothed by the LPF 32 may increase in response to an increase of the duty ratio of the PWM modulation waveform due to an increase of ambient temperature.

As shown in FIG. 2, the offset gain adding circuit 33 is configured of an inverting amplifier circuit including the operational amplifier 44, which adds a desired gain and an offset to the dc component of the LPF 32 so as to convert it into a temperature correction value 34, which is forwarded to the adder circuit 35 via the terminal 45. Using resistances R1, R2 of the gain-adding resistors 41a, 41b in the offset gain adding circuit 53, it is possible to calculate a gain α (i.e. a predetermined multiplier applied to an input signal) as α=−R2/R1 (entailing a negative sign due to inverse amplification). The resistances R1, R2 are adjusted in advance such that a temperature-dependent variation rate of a signal value adding a gain thereto (i.e. "variation of signal value"/"variation of temperature") will have the same absolute value as the temperature-dependent variation rate of the AGC control voltage 20 with a negative sign. Using the supply voltage of "1 V" applied to the terminal 42, and resistances R3, R4 of the offset adding resistors 43a, 43b, it is possible to calculate an offset β (or a predetermined constant) as β=R4/(R3+R4). In this connection, the resistances R3, R4 are adjusted in advance such that the gain and the signal value adding the offset thereto will be set to "0" at room temperature (27° C.). The adder circuit 35 adds the temperature correction value 34 to the AGC control voltage 20, before temperature compensation, so as to generate a temperature-compensated AGC control voltage 36, which is sent to the AVGA 13.

Figure 7:
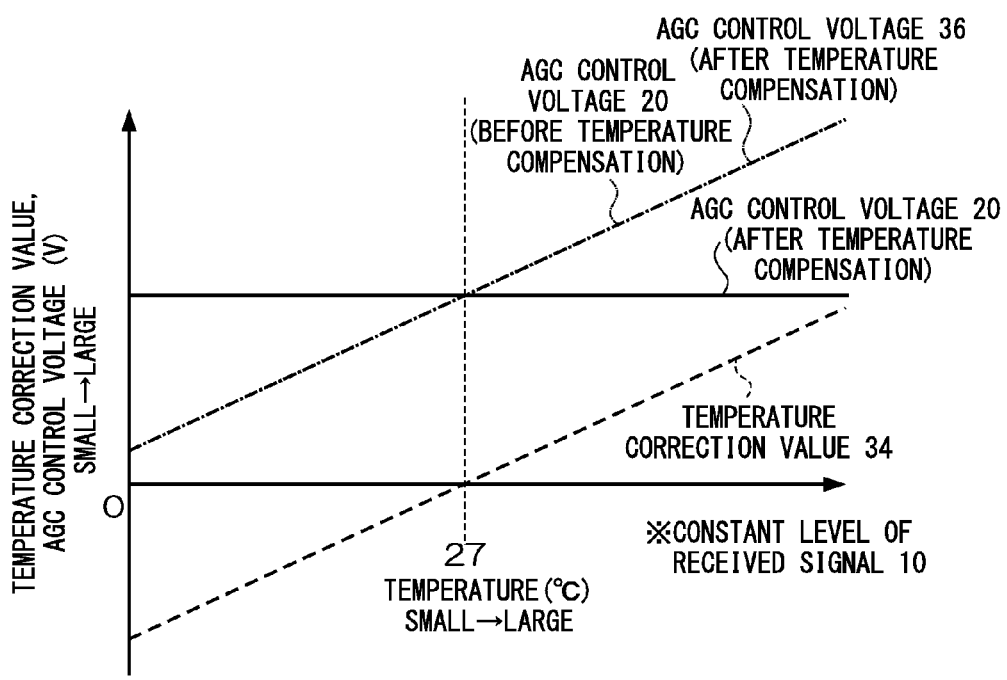
FIG. 7 A graph of temperature-dependent characteristics with respect to a temperature correction value and an AGC control voltage before and after temperature compensation.

FIG. 7 shows temperature-dependent characteristics with respect to the AGC control voltage 20 before temperature compensation, the AGC control voltage after temperature compensation, and the temperature correction value 34. Herein, the received signal remains at the constant level. As shown in FIG. 7, an inclination to the characteristics in the temperature correction value 34 has the same absolute value as an inclination to the characteristics in the AGC control voltage 20 (before temperature compensation) with an opposite polarity. Additionally, the temperature correction value 34 is set to "0" at room temperature (27° C.). The AGC control voltage 36 (after temperature compensation), which is produced by adding the temperature correction value 34 to the AGC control voltage 20 (before temperature compensation), is maintained at the same value as the AGC control voltage 20 at room temperature irrespective of variations in ambient temperature. Therefore, it is possible to normally maintain the AGC control range, relative to the level of the received signal 10 (IFmin to IFmax), in the optimum range which is set at room temperature.

The present embodiment is designed to smooth a PWM modulation waveform, which is produced by carrying out PWM modulation on temperature data of a temperature sensor, so as to generate a voltage value in response to variations in ambient temperature, wherein the voltage value is set to zero at a predetermined temperature and is adjusted such that the temperature-dependent variation rate thereof will have the same absolute value as the temperature-dependent variation rate of the AGC control voltage before temperature compensation with an opposite polarity, thus generating a temperature correction value. That is, by adding the temperature correction value to the AGC control voltage, it is possible to normally maintain an AVGA gain at a preset value at a desired temperature irrespective of variations in ambient temperature. This may prevent a temperature shift from occurring in the AGC control range; hence, it is possible to achieve optimum automatic gain control which will not degrade radio transmission characteristics due to variations in ambient temperature. Additionally, the present embodiment is designed to produce a temperature correction value based on a voltage value, which is produced by smoothing a PWM waveform with an analog circuit; hence, it is possible to smoothly converge an AVGA gain at a desired value in response to variations in ambient temperature.

Figure 8:
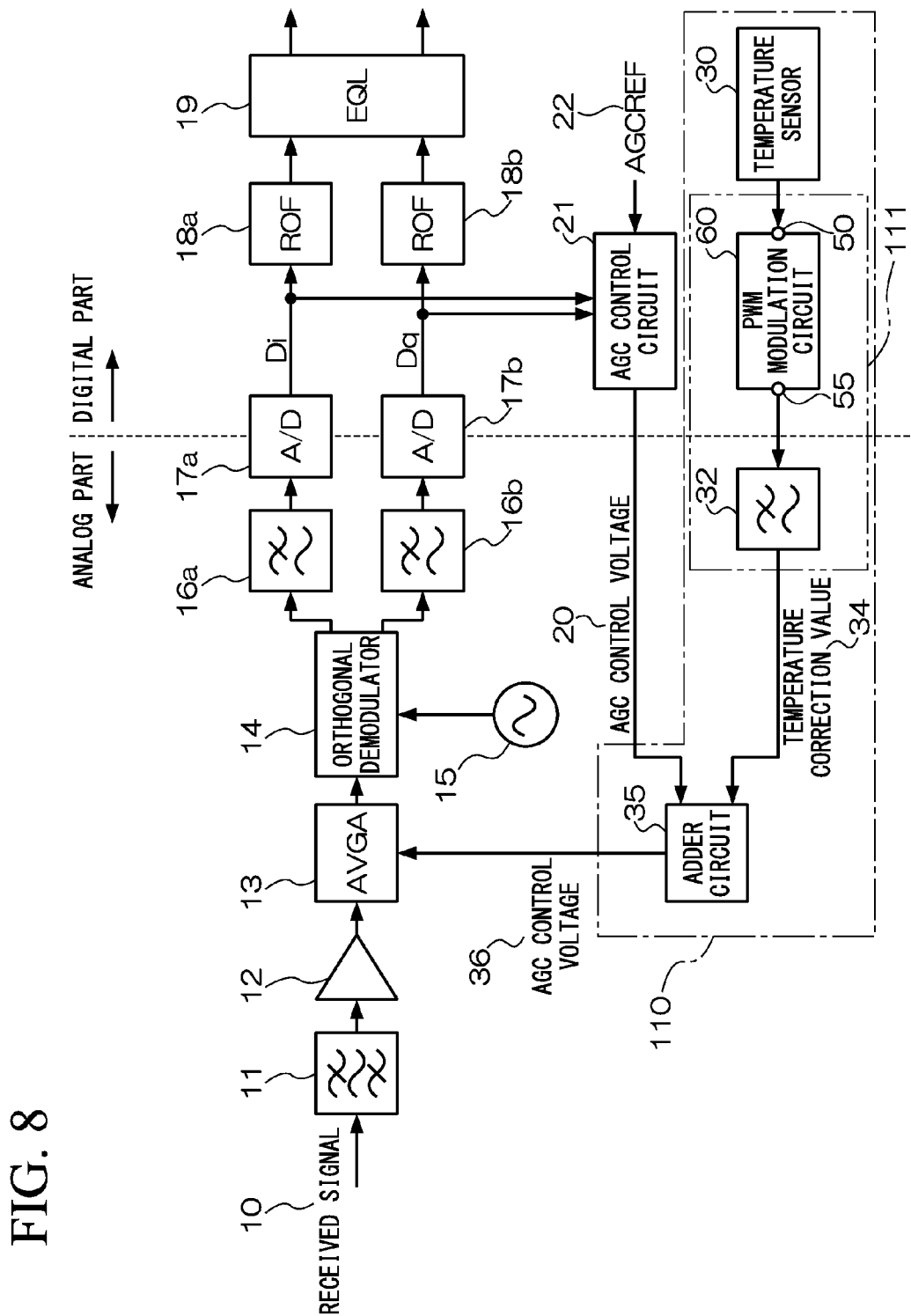
FIG. 8 A block diagram of a digital demodulation circuit according to a variation of the present embodiment.
Figure 9:
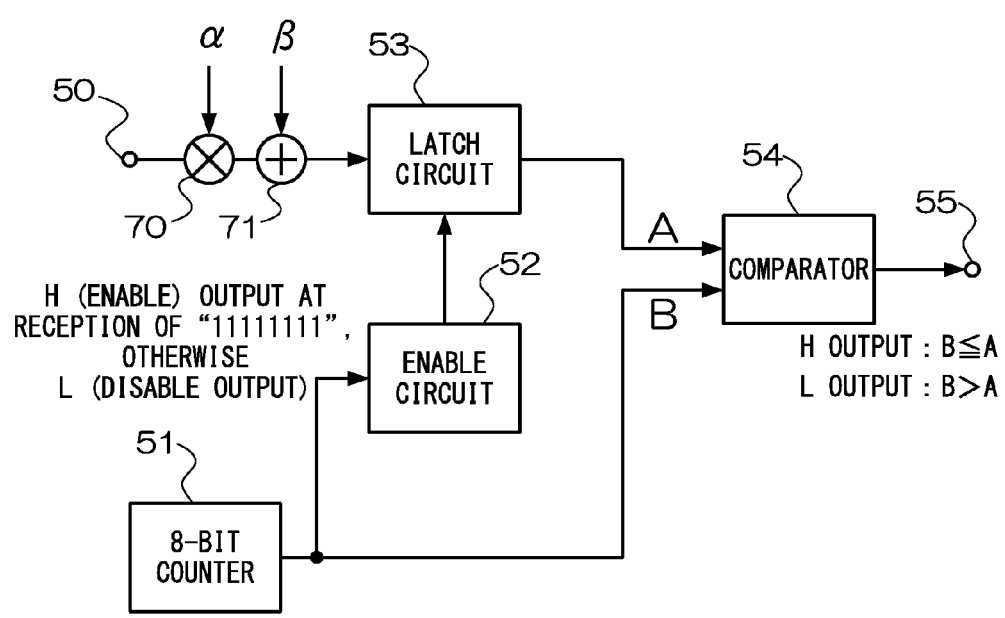
FIG. 9 A block diagram of a PWM modulation circuit shown in FIG. 8.

FIG. 8 is a block diagram of a digital demodulation circuit according to a variation of the present embodiment. Compared to the digital demodulation circuit of FIG. 1, the digital demodulation circuit of FIG. 8 precludes the offset gain adding circuit 33 while introducing a PWM modulation circuit 60 instead of the PWM modulation circuit 31. Compared to the digital demodulation circuit of FIG. 10, the digital demodulation circuit of FIG. 8 includes a block 110 encompassed by a dashed line. The block 111 indicates a temperature correction value generating circuit. This variation implements the function of the offset gain adding circuit 33, which is applied to a PWM modulation circuit 60, by way of digital signal processing. FIG. 9 is a block diagram of the PWM modulation circuit 60. The PWM modulation circuit 60 includes a gain-adding multiplier 70 and an offset-adding adder 71 in addition to the configuration of the PWM modulation circuit 31 (see FIG. 3). In the PWM modulation circuit 60, the multiplier 70 multiplies temperature data applied to the input terminal 50 by a gain α (i.e. a predetermined multiplier), and then the adder 71 adds an offset β (i.e. a predetermined constant) thereto. The PWM modulation circuit 60 carries out PWM modulation so as to output a PWM modulation waveform via the output terminal 55. The gain α determines the variation of the duty ratio of the PWM modulation waveform depending on variations in ambient temperature, i.e. an inclination to the temperature-dependent characteristics in the output signal of the LPF 32. The offset β determines an offset to the temperature-dependent characteristics in the output signal of the LPF 32. That is, the gain α is adjusted in advance such that an inclination to the temperature-dependent characteristics in the output signal of the LPF 32 will have the same absolute value as an inclination to the temperature-dependent characteristics in the AGC control voltage 20 (before temperature compensation) with the same polarity, while the offset β is adjusted in advance such that the output signal of the LPF 32 will be set to zero at a predetermined temperature (e.g. the lower-limit temperature during operation). Thus, it is possible to adjust the output signal of the LPF 32 with the temperature correction value 34.

According to the variation and the embodiment of the present invention, the offset gain adding circuit 33 or the PWM modulation circuit 60 multiplies temperature data (i.e. an ambient temperature), detected by the temperature sensor 30, by the multiplier α compensating for temperature-dependent variations of gain while adding the constant β thereto, thus generating the analog temperature correction value 34. That is, the digital demodulation circuit needs to retain the multiplier α and the constant β alone in advance. Additionally, the multiplier α and the constant β can be determined using an analog voltage value, applied to the terminal 42 of the offset gain adding circuit 33 (see FIG. 2), and the resistances R1 to R4 and can be retained as digital values input to the multiplier 70 and the adder 71 in the PWM modulation circuit 60 (see FIG. 9). It is possible to generate the analog temperature correction value 34 with a relatively simple circuit configuration because the LPF 32 is used to smooth a PWM modulation signal having a pulse width corresponding to temperature data indicating ambient temperature. Thus, the present embodiment and the variation can be realized using a simple circuit configuration compared to the conventional technology which implements a CPU process to read and process data stored in a memory device. Additionally, a receiver device including the digital demodulation circuit according to the present embodiment or the variation can be realized using a digital demodulation process having a temperature compensation function, which is performed on a received signal, with a relatively simple circuit configuration.

The present invention is not necessarily limited to the present embodiment and the variation. Additionally, it is possible to further modify the configuration of the present embodiment. For example, the offset gain adding circuit can be redesigned to change an inverting operational amplifier circuit with a non-inverting operational amplifier circuit while changing an adder circuit with a subtraction circuit.

INDUSTRIAL APPLICABILITY

The present invention achieves an automatic gain control circuit having a temperature compensation function with a simple circuit configuration, which is applicable to a digital demodulation circuit and a receiver device.

REFERENCE SIGNS LIST

11 BPF
12 power amplifier

13 AVGA
14 orthogonal demodulator
15 local oscillator
16a, 16b LPF
17a, 17b A/D converter
18a, 18b digital filter (ROF)
19 equalizer (EQL)
21 AGC control circuit
30 temperature sensor
31, 60 PWM modulation circuit
32 LPF
33 offset gain adding circuit
35 adder circuit
51 8-bit counter
52 Enable circuit
53 latch circuit
54 comparator
70 multiplier
71 adder

The invention claimed is:

1. A digital demodulation circuit comprising:
a variable gain control amplifier which amplifies a received signal of an intermediate frequency;
an orthogonal demodulator which converts the received signal, amplified by the variable gain control amplifier, into a baseband signal so as to separate it into a common-mode component and an orthogonal component;
an A/D converter which converts the common-mode component and the orthogonal component of the baseband signal into digital signals;
a gain control circuit which generates a first gain control voltage based on the digital signals;
a temperature compensation circuit which generates and smoothes a pulse-width modulation signal, having a pulse width corresponding to ambient temperature, so as to add a predetermined gain and an offset, compensating for variations in ambient temperature, thereto, thus generating a temperature correction value; and
an adder which adds the temperature correction value to the first gain control voltage so as to generate a second gain control voltage,
wherein the variable gain control amplifier amplifies the received signal with a gain corresponding to the second gain control voltage.

2. The digital demodulation circuit according to claim 1, wherein the gain control circuit generates the first gain control voltage based on a comparison result between a predetermined threshold and instantaneous power which is calculated via a sum of square of the common-mode component and the orthogonal component in the digital signals.

3. The digital demodulation circuit according to claim 1, wherein the temperature compensation circuit includes a pulse-width modulation circuit which generates the pulse-width modulation signal, having the pulse width corresponding to the ambient temperature, a low-pass filter which smoothes the pulse-width modulation signal, and an adder circuit which adds the predetermined gain and the offset to the smoothed pulse-width modulation signal so as to generate the temperature correction value.

4. The digital demodulation circuit according to claim 3, wherein the pulse-width modulation circuit includes a latch circuit which latches the temperature data representing the ambient temperature, a counter which produces a count value, an enable circuit which controls operation timing of the latch circuit in response to the count value, and a comparator which compares the temperature data of the latch circuit with the count value of the counter so as to generate the pulse-width modulation signal.

5. The digital demodulation circuit according to claim 1, wherein the temperature correction circuit includes a pulse-width modulation circuit which carries out digital processing on temperature data representing the ambient temperature so as to generate the pulse-width modulation signal, and a low-pass filter which smoothes the pulse-width modulation signal to generate the temperature correction value.

6. The digital demodulation circuit according to claim 5, wherein the pulse-width modulation circuit includes a digital processor which multiplies the temperature data representing the ambient temperature by a predetermined multiplier and adds a predetermined constant thereto, a latch circuit which latches the temperature data passing through the digital processor, a counter which produces a count value, an enable circuit which controls operation timing of the latch circuit in response to the count value, and a comparator which compares the temperature data of the latch circuit with the count value of the counter so as to generate the pulse-width modulation signal.

7. A receiver device which receives and converts a radio frequency signal into a received signal of an intermediate frequency so as to perform digital demodulation thereon, the receiver device including a digital demodulation circuit comprising:
a variable gain control amplifier which amplifies the received signal of the intermediate frequency;
an orthogonal demodulator which converts the received signal, amplified by the variable gain control amplifier, into a baseband signal so as to separate it into a common-mode component and an orthogonal component;
an A/D converter which converts the common-mode component and the orthogonal component of the baseband signal into digital signals;
a gain control circuit which generates a first gain control voltage based on the digital signals;
a temperature compensation circuit which generates and smoothes a pulse-width modulation signal, having a pulse width corresponding to ambient temperature, so as to add a predetermined gain and an offset, compensating for variations in ambient temperature, thereto, thus generating a temperature correction value; and
an adder which adds the temperature correction value to the first gain control voltage so as to generate a second gain control voltage,
wherein the variable gain control amplifier amplifies the received signal with a gain corresponding to the second gain control voltage.

* * * * *